United States Patent [19]

Suzuki

[11] 4,382,236
[45] May 3, 1983

[54] STRIP LINE CABLE USING A POROUS, CRYSTALLINE POLYMER DIELECTRIC TAPE

[75] Inventor: Hirosuke Suzuki, Tokorozawa, Japan

[73] Assignee: Junkosha Co., Ltd., Tokyo, Japan

[21] Appl. No.: 253,734

[22] Filed: Apr. 13, 1981

[30] Foreign Application Priority Data

Dec. 5, 1980 [JP] Japan .................................. 55-62608

[51] Int. Cl.³ .............................................. H01P 3/08
[52] U.S. Cl. ......................................... 333/1; 156/52;
174/117 FF; 333/236; 333/238; 428/209
[58] Field of Search ......... 174/117 F, 117 FF, 110 F,
174/110 FC; 428/209; 333/1, 236, 238, 246;
156/52

[56] References Cited

U.S. PATENT DOCUMENTS

| | | | |
|---|---|---|---|
| 3,408,453 | 10/1968 | Shelton, Jr. | 174/117 FF X |
| 3,516,859 | 6/1970 | Gerland et al. | 174/110 F |
| 3,586,757 | 6/1971 | Haldeman, Jr. | 174/117 FF |
| 3,763,306 | 10/1973 | Marshall | 174/117 F X |
| 3,764,727 | 10/1973 | Balde | 333/238 X |
| 4,098,628 | 7/1978 | Walton | 174/117 FF X |
| 4,149,026 | 4/1979 | Fritz et al. | 174/117 FF X |

*Primary Examiner*—Paul L. Gensler
*Attorney, Agent, or Firm*—Mortenson & Uebler

[57] ABSTRACT

A new strip line cable is provided comprising a dielectric in tape form made of a porous, crystalline polymer and one or more pairs of electrical conductors, each pair of conductors having one conductor located on one side of said tape and the other conductor located on the opposite side of said tape and in substantially parallel relationship to the first conductor of the pair, the pairs of conductors being arranged in substantially parallel transverse relationship across said tape, and insulating layers made of a suitable non-porous plastic material placed over the conductors to affix them to said dielectric tape and encapsulate the cable assembly. The preferred tape dielectric is expanded, porous polytetrafluoroethylene.

7 Claims, 5 Drawing Figures

STRIP LINE CABLE USING A POROUS, CRYSTALLINE POLYMER DIELECTRIC TAPE

BACKGROUND OF THE INVENTION

The present invention relates to a strip line cable comprising one or more pairs of electrical conductors arranged in a spaced, parallel relationship with each element of each pair of conductors being at opposite positions on either side of a dielectric tape, this assembly being encased between layers of non-porous plastic. More particularly, this invention concerns a strip line having excellent signal transmission performance and dimensional stability, and having resin materials that can be easily stripped away for termination.

It has been widely known that the use of materials having low dielectric constants, dielectric loss, and frequency dependence in transmission lines can achieve improved electric signal transmission performance. A lower dielectric constant of the dielectric in a strip line allows for a smaller line size and a faster signal propagation speed with the same characteristic impedance as larger lines have. Moreover, if the dielectric constant and the dielectric loss is less dependent on signal frequency, the wave form of a pulse signal is less deformed.

The dielectric material to be used in a strip line should, therefore, have a low dielectric constant and dielectric loss with low frequency dependence. Continuously porous, crystalline, polymeric materials having a microstructure of numerous fine nodes interconnected by fibrils with numerous void spaces or pores between the nodes and fibrils have been known to be one such material meeting the above requirements. Various known porous dielectric materials are produced, for example, by stretching, by mixed filler extraction or a fiber papering method, from such polymers as polyolefins (such as polyethylene, polypropylene, polystyrene), nylon, polyesters, and fluorocarbons (such as polytetrafluoroethylene, fluorinated ethylene propylene, perfluoroalkoxy resin, and ethylenetetrafluoroethylene resin). A typical example of such a material is an expanded porous polytetrafluoroethylene (hereinafter, PTFE) produced by the method described in Japanese Patent Publication Sho 51-18991 (corresponding to U.S. Pat. No. 3,953,566). However, this expanded porous PTFE is highly flexible and dimensionally unstable and, hence, it has heretofore been used as a dielectric in coaxial cables by wrapping it around a conductor. Nevertheless, it was thought to be unsuitable as a dielectric in a strip line having the construction mentioned above.

In spite of the above-mentioned disadvantage, the inventor pursued expanded porous PTFE in a strip line since it possesses all the characteristics (low dielectric constant and dielectric loss with less frequency dependence) required for the dielectric material in a strip line, and performed various experiments to determine how such a material could meet the dimensional stability requirements for a strip line dielectric while simultaneously maintaining the advantages of the material itself. After a series of experiments, the inventor has provided the improved strip line construction of the present invention.

SUMMARY OF THE INVENTION

A strip line cable is provided comprising a dielectric in tape form made of a porous, crystalline polymer and having at least one pair of electrical conductors, each pair of conductors having one conductor located on one side of the tape and the other conductor located on the opposite side of the tape and in substantially parallel relationship to the first conductor of the pair, and having outer insulating layers made of a suitable non-porous plastic material placed over the conductors to affix them to the dielectric tape and encapsulate the cable assembly. The non-porous plastic material is preferably selected from the class comprising polytetrafluoroethylene, perfluoroalkoxy resin, fluorinated ethylene propylene, ethylenetetrafluoroethylene resin or polyester. The porous, crystalline polymer is selected from the class comprising porous polyolefin, polyamide, polyester and polyfluorocarbon resins. The preferred porous crystalline polymer is expanded, porous PTFE.

DETAILED DESCRIPTION OF THE INVENTION WITH REFERENCE TO THE DRAWINGS

A new strip line cable is provided comprising a dielectric in tape form made of a porous, crystalline polymer and one or more pairs of electrical conductors, each pair of conductors having one conductor located on one side of said tape and the other conductor located on the opposite side of said tape and in substantially parallel relationship to the first conductor of the pair, the pairs of conductors being arranged in substantially parallel transverse relationship across said tape, and insulating layers made of a suitable non-porous plastic material placed over the conductors to affix them to said dielectric tape and encapsulate the cable assembly. The preferred tape dielectric is expanded, porous PTFE.

Briefly stated, the strip line of the present invention can be produced by placing a plurality of conductors onto the top and bottom faces (and, if necessary, in the middle) of a porous, crystalline polymer dielectric tape in a spaced, substantially parallel relationship with the conductors on the top and bottom faces being in opposite positions, then affixing non-porous or solid plastic material, such as PTFE, PFA, FEP, ETFE or polyester tape over the conductors and dielectric, and bonding the resultant assembly together by fusion or adhesion.

Referring to an embodiment of the present invention as shown in the attached drawings, the present invention will be more fully explained below.

Figure 1:
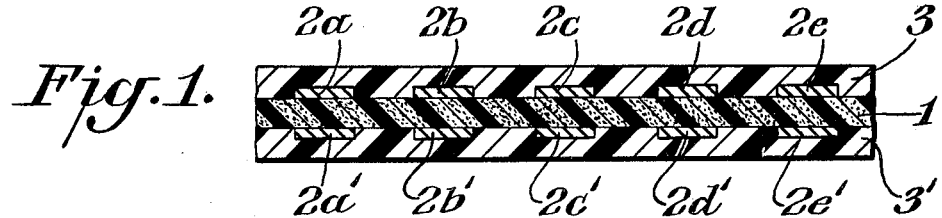
FIGS. 1 through 5 show examples of the cross section of strip line cable embodying the present invention. Numeral 1 indicates the dielectric ribbon or tape made of porous, crystalline polymer; 2a, 2a'; - - -, 2e, 2e' and 2a", - - - 2e" indicate conductors having high electrical conductivity; 3, 3' are the outer insulating layers; the portions 1' are the portions of the dielectric 1 having an increased dielectric constant; and 3a and 3a' are the concave or grooved portions formed in the outside insulating layer 3.

FIG. 1 shows an embodiment of the strip line of the present invention displayed as a fragmental cross section. In this embodiment, a sintered, expanded porous PTFE tape 1 was prepared. This tape was 0.127 mm thick, and was produced by conventional shaping of a PTFE mixture with a liquid lubricant by paste-extrusion and/or rolling into a tape. The liquid lubricant was removed from the shaped tape and the tape was stretched without lubricant being present to an extended length of three times its original length in the lengthwise direction at an ambient temperature of 300° C. The stretched tape was heated at a temperature of 360° C. while keeping it stretched. The porous, sintered, expanded PTFE tape so produced was almost fully sintered, and had a dielectric constant of 1.3. Onto both surfaces of the expanded, porous PTFE tape 1, five pairs of conductors were placed, each pair consisting of two conductors as indicated by $2a$, $2a'$; $2b$, $2b'$; $2c$, $2c'$; $2d$, $2d'$; and $2e$, $2e'$, of FIG. 1 with the two conductors constituting a pair being in opposite positions and the lateral conductors being in parallel, spaced positions transversely along the lengthwise direction.

Every conductor ($2a$, $2a'$, - - - ; $2e$, $2e'$) was a silver plated, flat, copper conductor, 0.5 mm wide and 0.1 mm thick. The number of pairs can be selected as desired. In this instance, it was set, for convenience of explanation, at five. After the conductors had been placed on both sides of the expanded PTFE tape 1, unsintered, unstretched PTFE tapes, 0.25 mm thick, were placed, one per side, over both sides of the dielectric tape 1 and conductors. The resultant assembly was passed through at least one pair of compression rolls (not shown), and then through a molten salt bath (not shown) maintained at a temperature of 370° C. for 30 seconds. As a result of this treatment, the unexpanded PTFE outer tapes were sintered and bonded to the expanded, inner, porous PTFE dielectric tape 1 to form the sintered, unified outer insulation layers 3 and 3'.

In the strip line thus obtained, the final thickness of the dielectric expanded porous PTFE tape 1 was 0.11 mm, and the spacing between adjacent conductors was 1.27 mm. The characteristic impedance of this strip line was 45 ohms, and the propagation delay time was 3.9 nsec/m which was faster than the propagation delay time obtained from a strip line of the same size utilizing unexpanded PTFE as its dielectric tape (4.7 nsec/m). The pulse transmission performance and cross-talk characteristics, both between opposite conductors and between lateral conductors, are superior in the strip line of this invention utilizing the expanded porous PTFE tape when compared to those using unexpanded PTFE tape.

As can be understood from the above explanation, due to the use of expanded porous PTFE having a low dielectric constant and dielectric loss with low frequency dependence, the strip line of the present invention possesses excellent electric signal transmission properties. Moreover, due to the use of solid insulation layers on both faces of the dielectric (which is harder in texture than the expanded PTFE dielectric and which compensates the dimensional instability resulting from the flexibility inherent in expanded PTFE), the strip line of the present invention ensures the overall dimensional stability sufficient for normal use, even under flexure.

Still further, the structure of the strip line, in which the insulating layers (having a dielectric constant higher than that of the expanded PTFE dielectric) are affixed to both faces of the dielectric, prevents the electric field between adjacent conductors from being radiated to the outside, thus reducing cross-talk both between layers when stacked and between adjacent conductors. Furthermore, the above structure of the present invention provides ease of termination where the outside insulation layers and the dielectric can be easily removed by cutting with a sharp blade, such as a razor or knife, perpendicular to the lengthwise direction and sliding the blade in place in the lengthwise direction. By adjusting the depth of the cut, only the outside insulation layers are removed, leaving the dielectric intact. Depending on the intended use, an electromagnetic shield layer, such as metal foil, electroconductive fluorocarbon resin or the like may be installed on the surface of the outside insulation. If the shield layer is so close to the conductors so as to deteriorate the cable performance, the thickness of the insulation layer should be increased or, alternatively, a layer of porous crystalline polymer should be affixed between the shield and the insulation. The latter case may provide an additional advantage allowing the shield to be removed from the cable more easily.

Figure 2:
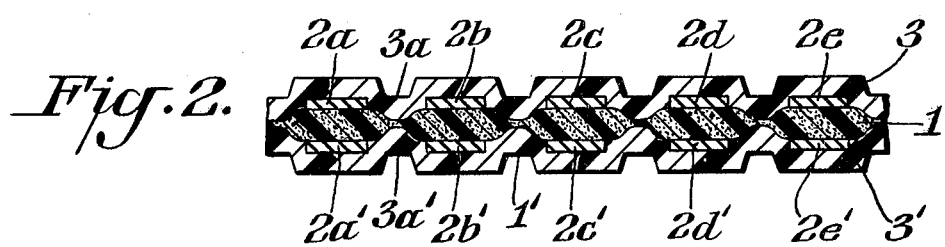

FIG. 2 shows another example of the embodiment of the present invention. As shown in FIG. 2, the assembly consisting of the dielectric, conductors and insulation was compressed by grooved rolls having ridges to compress the portions of the tapes between adjacent conductors. The strip line thus obtained possessed concave portions $3a$ and $3a'$ created in the outside insulation layers 3 and 3'. The dielectric 1 was also compressed to form the thinner portions $1'$. The dielectric 1 shaped as shown in FIG. 2 was less porous at the thinner portions $1'$ where the dielectric constant was higher than at other portions of the dielectric. As a result, each pair of conductors ($2a$, $2a'$; - - - ; $2e$, $2e'$) was surrounded by the thinner portions $1'$ and the outside insulation layers 3 and 3'. The dielectric constants of these surrounding portions were high enough to reduce the diffusion of electromagnetic waves from each conductor pair, thereby decreasing the cross-talk either between conductors or between stacked conductor layers. Compression using ridged rolls to form grooves between conductors prevents deformation due to pressure exerted on the thickness of the strip line.

Figure 3:
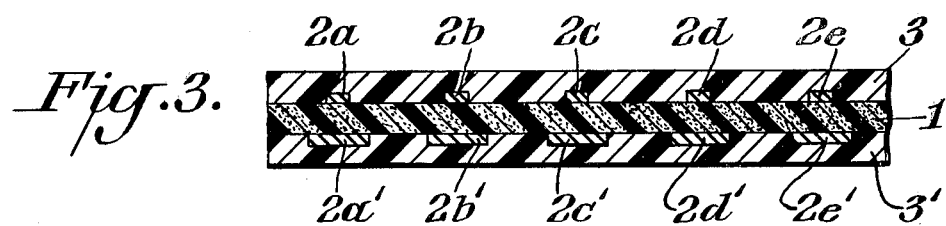
Figure 4:
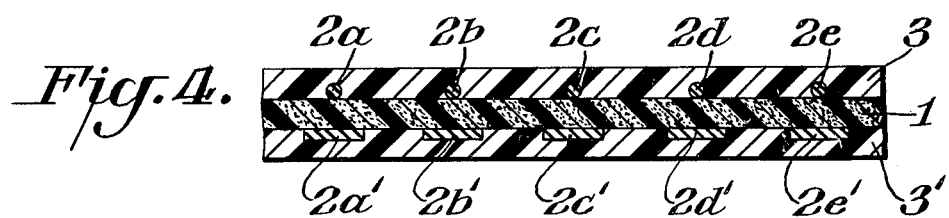
Figure 5:
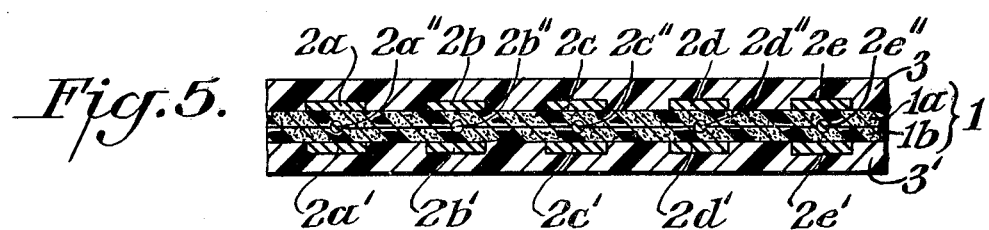

FIGS. 3, 4 and 5 show other examples of possible embodiments of the present invention. In the strip line of FIG. 3, the conductors $2a$, $b$, $c$, $d$ and $e$, placed on one side of the dielectric 1, are narrower in width than the conductors $2a'$, $b'$, $c'$, $d'$ and $e'$ placed on the other side of the dielectric 1.

In the strip line of FIG. 4, the conductors $2a$, $b$, $c$, $d$, and $e$, arranged in a plane on the dielectric 1, are round conductors.

In the strip line of FIG. 5, the dielectric 1 consists of two sheets of tape $1a$ and $1b$, between which round conductors $2a''$, $b''$, $c''$, $d''$, and $e''$ are interposed, one per pair along the center line of each pair of conductors $2a$, $2a'$; $2b$, $2b'$; $2c$, $2c'$; $2d$, $2d'$; and $2e$, $2e'$. It is easily seen that the strip lines as shown in FIGS. 3–5 have the excellent features as explained with reference to FIG. 1.

The dielectric tapes $1a$ and $1b$ should be bonded together in such a way that they can be easily separated by exerting a peeling force in order to form a terminal. For the same purpose, the dielectric in the other embodiments may consist of two or more tapes.

In either embodiment mentioned above, at least one surface of the expanded, porous PTFE dielectric in tape form may be covered with a solid or non-porous plastic layer in order to increase the durability of the dielectric property of the strip line.

The conductors to be used in the strip line of the present invention are not limited to only flat or round conductors, but they may also be quality stranded and bunched conductors such as copper, silver-plated copper, copper clad steel, gold-plated stainless or the like.

The type, combination, and number of conductors are not limited to those as shown in FIGS. 1–5. For example, in FIG. 4 the position of conductor 2b in relation to 2b' and 2d in relation to 2d' may be changed for the purpose of improving cross-talk characteristics between conductors. Similar to the cable of FIG. 2, concave or grooved portions may be produced for the constructions shown in FIG. 4 and FIG. 5. Since the reason for grooving the insulation and dielectric is to increase the dielectric constant of the grooved portions over that of the other portions, any other suitable means of increasing the dielectric constant may be employed in place of the grooving method. If the use of stacked cables is intended, reduction of the thickness of the flat signal conductors to a thickness less than the ground conductors may improve cross-talk between stacked cables.

The strip line cable can be slit at desired places (end or midway) between adjacent pairs of conductors into individual pairs to improve cross-talk, handling, bend characteristics, etc.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A strip line cable comprising a dielectric in tape form made of a porous, crystalline polymer having a low dielectric constant approaching that of air and having at least one pair of electrical conductors, each said pair of conductors having one conductor located on one side of said tape and the other conductor located on the opposite side of said tape and in substantially parallel relationship to the first conductor of the pair, and having outer insulating layers made of a suitable non-porous plastic material placed over said conductors to affix them to said dielectric tape and encapsulate the cable assembly.

2. The strip line of claim 1 wherein said non-porous plastic material is selected from the class consisting of polytetrafluoroethylene, perfluoroalkoxy resin, fluorinated ethylene propylene, ethylenetetrafluoroethylene resin and polyester.

3. The strip line of claim 1 having at least one electrical conductor located in said dielectric between at least one said pair of conductors.

4. The strip line of claim 1 having a plurality of pairs of said conductors, the pairs of said conductors being arranged in substantially parallel transverse relationship across said tape.

5. The strip line of claim 4 wherein the dielectric constant of said dielectric is greater at the transverse location between at least one pair of said paired conductors than at other locations within said dielectric tape.

6. The strip line of claim 1 wherein said porous, crystalline polymer is selected from the class consisting of porous polyolefin, polyamide, polyester, and polyfluorocarbon resins.

7. The strip line of claim 3 wherein said porous, crystalline polymer is porous, expanded polytetrafluoroethylene.

* * * * *